United States Patent
Llanos et al.

(10) Patent No.: US 9,915,932 B2
(45) Date of Patent: Mar. 13, 2018

(54) SYSTEM AND METHOD FOR EQUIPMENT MONITORING USING A GROUP CANDIDATE BASELINE AND PROBABILISTIC MODEL

(71) Applicant: Applied Materials, Inc., Santa Clara, CA (US)

(72) Inventors: Paul Alexander Llanos, South Salem, NY (US); Roger Steele Cornell, Poughkeepsie, NY (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 370 days.

(21) Appl. No.: 14/556,728

(22) Filed: Dec. 1, 2014

(65) Prior Publication Data

US 2016/0154395 A1   Jun. 2, 2016

(51) Int. Cl.
 *G05B 19/42*   (2006.01)
 *G05B 19/042*   (2006.01)
 *G05B 19/418*   (2006.01)
 *G05B 23/02*   (2006.01)
 *H01L 21/66*   (2006.01)

(52) U.S. Cl.
 CPC ... *G05B 19/0428* (2013.01); *G05B 19/41875* (2013.01); *G05B 23/02* (2013.01); *H01L 22/00* (2013.01); *H01L 22/20* (2013.01); *G05B 2219/32179* (2013.01); *G05B 2219/32201* (2013.01); *G05B 2219/32222* (2013.01); *G05B 2219/45031* (2013.01); *H01L 22/12* (2013.01)

(58) Field of Classification Search
 CPC ...... G05B 19/0428; G05B 2219/37603; G05B 23/024; H01L 22/20; H01L 21/67276
 USPC ................................................ 700/110, 108
 See application file for complete search history.

(56) References Cited

U.S. PATENT DOCUMENTS

| | | | | |
|---|---|---|---|---|
| 7,467,063 | B2* | 12/2008 | Archie | G03F 7/70516 324/512 |
| 8,467,993 | B2* | 6/2013 | Archie | G05B 23/0237 702/179 |
| 2007/0097763 | A1* | 5/2007 | Tokorozuki | H01L 22/20 365/201 |
| 2008/0275586 | A1* | 11/2008 | Ko | G05B 23/0221 700/110 |
| 2008/0312858 | A1* | 12/2008 | Baseman | G05B 19/41875 702/83 |
| 2010/0312374 | A1* | 12/2010 | Tsai | G01R 31/2894 700/110 |

(Continued)

Primary Examiner — Ziaul Karim
Assistant Examiner — Joshua Sanders
(74) Attorney, Agent, or Firm — Lowenstein Sandler LLP (57) ABSTRACT

Systems and methods are provided for monitoring equipment in a semiconductor manufacturing facility. A processing device maintains baseline measurement record generated from measurements performed by a plurality of tools over a first time range. A measurement record is received, the measurement record corresponding to a measurement performed on a wafer, the wafer having been processed by a first tool of the plurality of tools. The measurement record is stored in a drift candidate table corresponding to a second time range. A determination is made as to whether the measurement record satisfy a set of excursion rules in view of the drift candidate table, and, in response to the determination, the measurement record is stored in an alert table.

13 Claims, 10 Drawing Sheets

(56) References Cited

U.S. PATENT DOCUMENTS

2015/0234379 A1* 8/2015 Vajaria .................. H01L 22/12
  700/121

* cited by examiner

Baseline Candidate Table 500

| Target | EP | $V_{acc}$ | Orient. | # Tools |
|---|---|---|---|---|
| T1 | Line | 530 | 90 | 3 |
| T2 | Space | 530 | 90 | 3 |
| T3 | Line | 530 | 0 | 3 |
| T4 | Space | 830 | 90 | 3 |

Tool 502

| Target | $C_p$ | TCD | FCD | Fσ | T-F | TFS | Wafers | Lots | NA/Wafer |
|---|---|---|---|---|---|---|---|---|---|
| T1 | 1.2 | 96.3 | 96.7 | 1.2 | -0.4 | -0.3 | 9 | 3 | 0.00 |
| T2 | 2.5 | 23.2 | 23.1 | 2.4 | 0.2 | 0.1 | 24 | 8 | 0.20 |
| T3 | 3.4 | 53.3 | 55.4 | 3.4 | -2.2 | -0.6 | 36 | 12 | 0.10 |
| T4 | 1.1 | 23.5 | 23.6 | 1.5 | -0.1 | -0.1 | 48 | 16 | 0.04 |

Tool 504

| Target | $C_p$ | TCD | FCD | Fσ | T-F | TFS | Wafers | Lots | NA/Wafer |
|---|---|---|---|---|---|---|---|---|---|
| T1 | 1.7 | 97.5 | 96.1 | 0.3 | 1.4 | 4.4 | 6 | 2 | 0.00 |
| T2 | 3.0 | 24.7 | 22.3 | 1.3 | 2.4 | 1.9 | 21 | 7 | 0.00 |
| T3 | 3.9 | 57.9 | 53.1 | 0.2 | 4.7 | 30.3 | 33 | 11 | 0.00 |
| T4 | 1.6 | 24.7 | 23.0 | 0.7 | 1.7 | 2.5 | 54 | 18 | 0.03 |

Tool 506

| Target | $C_p$ | TCD | FCD | Fσ | T-F | TFS | Wafers | Lots | NA/Wafer |
|---|---|---|---|---|---|---|---|---|---|
| T1 | 0.8 | 95.9 | 96.9 | 0.8 | -1.1 | -1.2 | 12 | 4 | 0.00 |
| T2 | 2.1 | 21.4 | 24.0 | 1.1 | -2.6 | -2.4 | 33 | 11 | 0.04 |
| T3 | 3.0 | 53.0 | 55.6 | 3.3 | -2.5 | -0.8 | 66 | 22 | 0.00 |
| T4 | 0.7 | 22.6 | 24.1 | 0.8 | -1.6 | -1.9 | 18 | 6 | 0.00 |

FIGURE 5A

Drift Candidate Table 540

| Date/Time | EP | Target | $V_{acc}$ | Orient. | Tool | Avg. CD | σ | C% |
|---|---|---|---|---|---|---|---|---|
| 3/1/2014; 1:21 | Line | T1 | 530 | 90 | Tool A | 96.59 | -0.37 | 96.59 |
| 3/1/2014; 3:31 | Space | T2 | 530 | 90 | Tool B | 23.11 | 2.17 | 23.11 |
| 3/1/2014; 5:26 | Line | T3 | 530 | 0 | Tool C | 73.28 | -2.19 | 54.71 |
| 3/1/2014; 9:23 | Space | T4 | 830 | 90 | Tool B | 23.60 | -0.11 | 23.60 |
| 3/1/2014; 9:23 | Line | T5 | 530 | 0 | Tool C | 64.71 | -3.63 | 54.71 |

Alert Table 560

| Date/Time | Tool | $V_{acc}$ | Orient. | CD Band | Avg. Drift | σ | C% |
|---|---|---|---|---|---|---|---|
| 3/1/2014; 9:23 | Tool C | 530 | 0 | 20-60nm | 0.56 nm | 2.24 | 82 |
| 2/28/2014; 11:23 | Tool C | 800 | 90 | 50-90nm | 0.67 nm | 2.45 | 75 |
| 2/27/2014; 6:55 | Tool C | 830 | 90 | 100-200nm | -2.4 nm | -8.34 | 89 |
| 2/26/2014; 5:34 | Tool C | 802 | 0 | 300-500nm | 5.7 nm | -2.35 | 92 |

Tool Data 562
Fleet Data 564

SYSTEM AND METHOD FOR EQUIPMENT MONITORING USING A GROUP CANDIDATE BASELINE AND PROBABILISTIC MODEL

TECHNICAL FIELD

Implementations of the present disclosure relate to a semiconductor manufacturing system, and more specifically to equipment monitoring in a semiconductor manufacturing system.

BACKGROUND

Manufacturing facilities often utilize real-time monitoring to ensure that various pieces of equipment are operating within allowable tolerances. In semiconductor manufacturing facilities in particular, improving the control of a fleet of manufacturing tools to act interchangeably has become increasingly important in the face of 3D metrology and tight design rules. Each tool of the fleet may perform measurements in real-time to ensure that measurements of critical dimension of features are within acceptable ranges. Traditional methods have focused on improving upon the measurement uncertainty on dedicated monitoring artifacts. In doing so, however, such methods are more sensitive to the dedicated monitoring artifacts rather than to the performance of the fleet on production artifacts, and thus lack the ability to identify excursions early on during steady state fleet operation.

BRIEF DESCRIPTION OF THE DRAWINGS

The present disclosure is illustrated by way of example, and not by way of limitation, in the figures of the accompanying drawings in which like references indicate similar elements. It is noted that different references to "an" or "one" implementation in this disclosure are not necessarily to the same implementation, and such references mean at least one.

DETAILED DESCRIPTION

Implementations of the disclosure are directed to a method and system for monitoring equipment in a semiconductor manufacturing system. The monitoring may be achieved by applying aggregate statistics of a group of equipment (tools) relative to an individual piece of equipment, for example, by utilizing a candidate baseline and a probabilistic model in the form of excursion rules. In one implementation, a system collects raw process running signals or measurement equipment data. The system implements an algorithm for aggregating the raw data to establish candidate baselines for a fleet of equipment. A probabilistic model is used to determine outlier equipment with high signal-to-noise. Analyzing populations of data in this way allow the system to map identified excursions back to individual pieces of equipment.

The implementations described herein offer several advantages over current monitoring strategies. A first advantage is sensitivity to the production artifacts rather than sensitivity to monitoring artifacts by accounting for up to about 95% more variety in the sampling that is used for referencing and comparing performance. Current monitoring strategies use repeated runs of the same artifact to verify whether equipment is performing within control limits. However, such strategies typically rely on trace data with a known signature. If the monitoring artifact does not detect an issue with a tool when an issue exists, then the product may be compromised.

A second advantage is that of early detection and correction of issues with the equipment. Depending on production artifacts, the disclosed implementations improve upon early detection and correction by at least 50%. For example, if monitoring is performed one time per day, corrective action may be taken at a minimum of every 24 hours. Current strategies involve monitoring an artifact daily or at some longer interval. However, this exposes the product to excursions that might occur between monitor intervals.

A third advantage is a reduction in false positives by at least a 20% due to higher sampling and by applying confidence scoring to samples. Current strategies typically employ relatively low sampling rates in intervals of one day or greater, increasing the potential for false positives.

It is noted that while the disclosed implementations are described in the context of a semiconductor manufacturing facility, the implementations are not limited to such. It is to be understood that the disclosed implementations may be useful in the detection of outliers in other systems/environments involving groups of devices that generate measurable signals. Examples include a server cluster for high-performance computing, a fuel management system for a fleet of aircraft, and various production environments.

Figure 1:
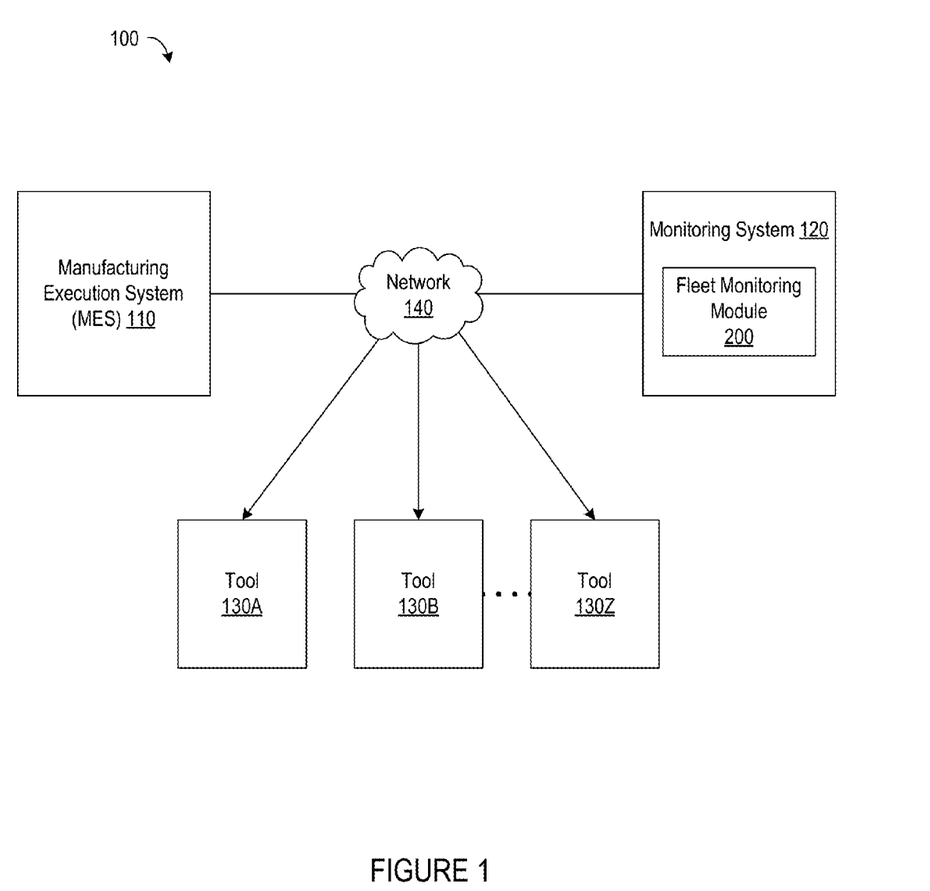
FIG. 1 is a block diagram illustrating a manufacturing system according to one implementation.

FIG. 1 is a block diagram illustrating a manufacturing system 100 including a fabrication system data source (e.g., manufacturing execution system (MES) 110), a monitoring system 120, and tools 130A-130Z, with each system/server configured to communicate with each other, for example, via a network 140. The network 140 can be a local area network (LAN), a wireless network, a mobile communications network, a wide area network (WAN), such as the Internet, or similar communication system.

The MES 110, monitoring system 120, and fleet monitoring module 200, can be individually hosted by any type of computing device including server computers, gateway computers, desktop computers, laptop computers, tablet computers, notebook computers, personal digital assistants (PDAs), mobile communications devices, cell phones, smart phones, hand-held computers, or similar computing devices. Alternatively, any combination of MES 110, monitoring system 120, and fleet monitoring module 200 can be hosted on a single computing device including server computers, gateway computers, desktop computers, laptop computers, mobile communications devices, cell phones, smart phones, hand-held computers, or similar computing devices.

In one implementation, the MES 110 may be a server of the manufacturing system 100 that controls, monitors, and allocates lots to the tools 130A-130Z. The MES 110 may automate all manufacturing processes, or may be controlled by an operator who may override at least some of the automation performed by the MES 110.

In one implementation, the tools 130A-130Z may be any tool used for manufacturing semiconductor devices and/or characterizing features (e.g., critical dimensions) of semiconductor devices. For example, one or more of the tools 130A-130Z may process wafers in parallel, in series, or in combinations thereof. For example, tools 130A and 130B may perform an identical thin film deposition process on different wafers. As another example, tool 130A may process a wafer (e.g., deposition), and then tool 130B may perform a subsequent process on the wafer (e.g., etching). In some implementations, one or more of the tools may be measurement devices (e.g., profilometers, electron microscopes, atomic force microscopes, etc.) for performing metrology or some other type of characterization. In some implementations, one or more of the tools may perform a processing step on a wafer and also be configured to perform a characterization step. For example, tool 130A may be a laser milling machine that is capable of generating a hole/well on the surface of the wafer and measuring a diameter of the well. Any suitable number of tools may be part of the manufacturing system 100 (e.g., 20 tools, 40 tools, etc.).

In one implementation, the monitoring system 120 may include a fleet monitoring module 200 that receives and processes measurement data/records from the tools 130A-130Z. For example, the fleet monitoring module 200 can analyze real-time measurement data generated by tools 130A-130Z, determine if any excursions exist in the measurement data, and generate alert indications that may serve as maintenance requests for a particular tool, shut down a particular tool, etc. An illustrative fleet monitoring module 200 is described below with respect to FIG. 2.

Figure 2:
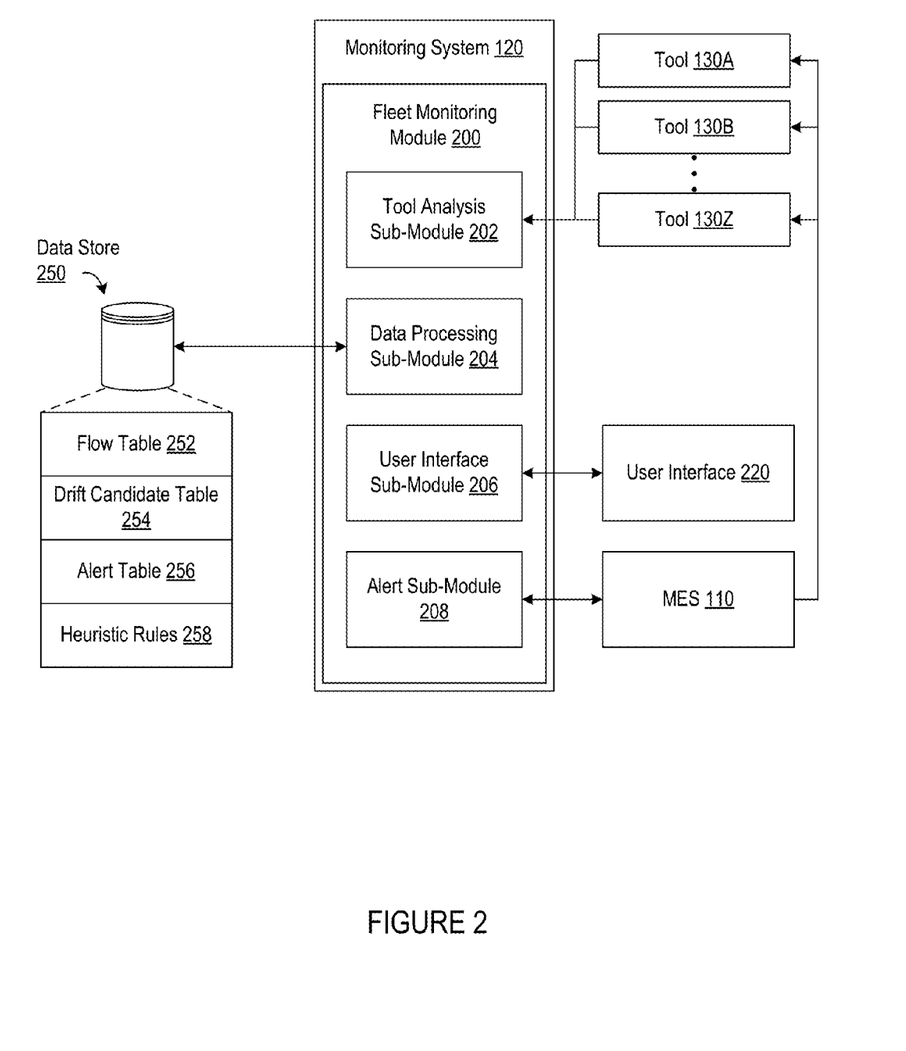
FIG. 2 is a block diagram of one implementation of a fleet monitoring module according to one implementation.

FIG. 2 is a block diagram of one implementation of a fleet monitoring module 200 according to one implementation. In one implementation, the fleet monitoring module 200 can be the same as the fleet monitoring module 200 of FIG. 1. The fleet monitoring module 200 may include a tool analysis sub-module 202, a data processing sub-module 204, a user interface (UI) sub-module 206, and an alert sub-module 208. The fleet monitoring module 200 may further include (e.g., as part of the monitoring system 120) or be communicably coupled to a data store 250.

In one implementation, the data store 250 can be a persistent storage unit, which may be a local storage unit or a remote storage unit. The persistent storage unit can be a magnetic storage unit, optical storage unit, solid state storage unit, electronic storage unit (main memory) or similar storage unit. The persistent storage unit can also be a monolithic device or a distributed set of devices. A 'set', as used herein, refers to any positive whole number of items. In some implementations, the data store 250 may be maintained on any device available via the network 140. For example, data store 250 may be maintained on a server computer, gateway computer, desktop computer, laptop computer, mobile communications device, cell phone, smart phone, hand-held computer, or similar computing device.

The data store 250 may include flow table data 252, drift candidate table data 254, alert table data 256, and heuristic rules 258. The flow table data 252 can include target measurement data acquired by the fleet of tools 130A-130Z over a first rolling time range (e.g., a day, two days, a week, etc.). The flow table data 252 may arrange measurement data according to tool and target type (e.g., a line width, a hole size, a line spacing, or any other suitable feature). The drift candidate table 254 may correspond to a second rolling time range (e.g., 12 hours, 24 hours, etc.), which may be shorter than the first rolling time range and may overlap therewith. Measurement records of the flow table data 252 may be added to the drift candidate table 254 if a drift is suspected, which may be processed when sufficient data is acquired in order to confirm the drift (e.g., using the heuristic rules 258). The alert table 256 may contain measurement records that satisfy the heuristic rules 258, which correspond to confirmed measurement drifts for one or more of the tools 130A-130Z.

In one implementation, the tool analysis sub-module 202 receives measurement records from one or more tools 130A-130Z. In some implementations, the tool analysis sub-module 202 may receive measurement records from the MES 110, rather than directly from the tools 130A-130Z. A measurement record may correspond to a measurement performed by one of the tools 130A-130Z on a particular wafer, and may include information such as a measurement value (e.g., corresponding to a measurement of a target feature on the wafer), a time in which the measurement was performed, parameters of the measurement (e.g., type of target feature, orientation of the measured feature, working point ($V_{acc}$) of a critical-dimension scanning electron microscope (CDSEM) including electron beam landing energy and detection scheme, etc.), or any other suitable measurement parameters.

In one implementation, the data processing-sub module 204 may identify excursions in the measurement data, as will be discussed below in detail with respect to FIG. 3. Excursions may be identified applying a set of one or more excursion rules defined in the heuristic rules data 258. For example, excursion rules may include, but are not limited to: determining that a measurement value of a measurement record exceeds a first threshold range with a confidence value computed based on the drift candidate table; determining that a pre-defined number of excursions have occurred for the first tool during the second time range; or determining that the measurement value of the measurement record exceeds a second threshold range with respect to an average critical dimension computed from the baseline measurement data (e.g., 1-2% of the critical dimension). Other excursion rules may also be applied.

In one implementation, user interface (UI) sub-module 206 can present in a user interface 220 any of the data acquired by monitoring system 120. The user interface 220 can be a graphical user interface (GUI) implemented on any suitable device, and may allow a user to visualize drift data reports, raw measurement data, and alerts. The user interface 220 may also allow the user to define, add/remove, and modify excursion rules. The GUI may also be implemented on a different device than monitoring system 120.

In one implementation, the alert sub-module 208 may transmit some or all of the data of the alert table 256 (e.g., to the MES 110), and/or one or more alert indications. For example, the alert indications may indicate that one of the tools 130A-130Z should be shut down to receive maintenance to correct measurement drifts. In some implementations, the alert indication is transmitted to one of the tools 130A-130Z, which causes the tool to shut down. In some implementations, the alert indication is transmitted to the MES 110, which shuts down the tool or receives an instruction from an operator to shut down the tool. In some implementations, the alert indication is sent to one or more devices used by the operator, and the operator may manually shut down the tool.

Figure 3:
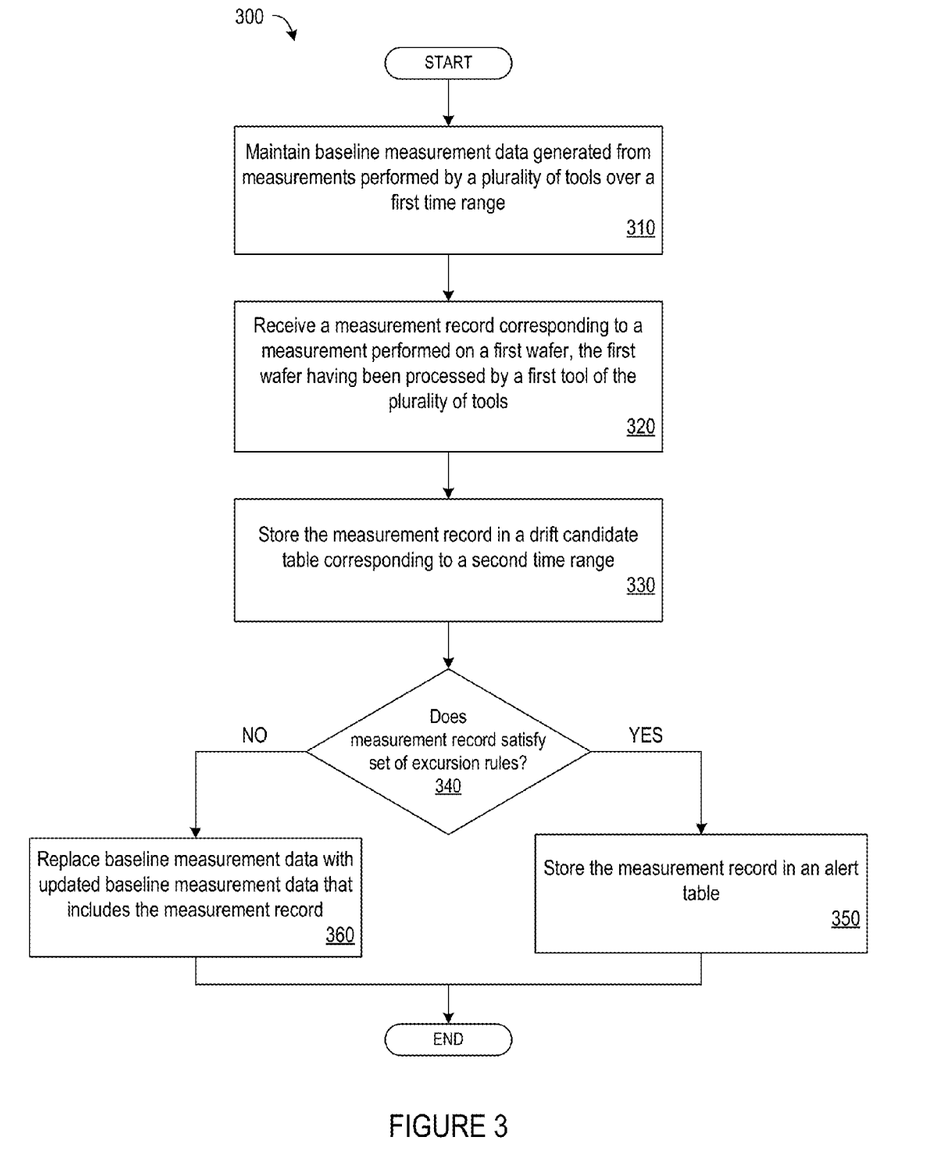
FIG. 3 is a flow diagram illustrating a method for monitoring equipment using a group candidate baseline according to one implementation.

FIG. 3 is a flow diagram illustrating a method for monitoring equipment using a group candidate baseline according to one implementation. Method 300 can be performed by processing logic that can comprise hardware (e.g., circuitry, dedicated logic, programmable logic, microcode, etc.), software (e.g., instructions run on a processing device), or a combination thereof. In one implementation, method 300 is performed by a manufacturing system (e.g., fleet monitoring module 200 of monitoring system 120 described with respect to FIGS. 1 and 2), as described below. It is noted, however, that any suitable computing device described herein can perform method 300, and that the fleet monitoring module 200 is an illustrative example.

At block 310, a fleet monitoring module (e.g., fleet monitoring module 200) maintains baseline measurement data (e.g., flow table data 252) generated from measurements performed by a plurality of tools (e.g., tools 130A-130Z) over a first time range. In some implementations, the measurements performed by the plurality of tools comprise at least one of a line width measurement, a line spacing measurement, or a hole diameter measurement. In some implementations, the first time range is a rolling time range (e.g., a 1-day period, a 3-day period, a 7-day period, etc.). For example, the rolling time range may include measurement records that are dated between a specific time (e.g., 12:00 am at the beginning of the current day, the present time, etc.) and an earlier time (e.g., 1 day before the specific time, 3 days before the specific time, 7 days before the specific time, etc.), while records outside of the rolling range are discarded or archived. In some implementations, the first time range (if it is a rolling time range) may change with time (e.g., the baseline measurement data may be updated to correspond to a new time range at the beginning of each day).

At block 320, the fleet monitoring module receives (e.g., by the tool analysis-sub module 202) a measurement record corresponding to a measurement performed on a wafer, the wafer having been processed by a first tool (e.g., tool 130A) of the plurality of tools. In some implementations, the wafer may be a 200 mm wafer, a 300 mm wafer, or any other suitably sized wafer.

At block 330, the fleet monitoring module stores the measurement record in a drift candidate table corresponding to a second time range. In one implementation, storing the measurement record in the drift candidate table includes comparing a measurement value associated with the measurement record to a baseline value. The baseline value may be computed from average measurement values of the baseline measurement data, the average measurement values being associated with a subset of the plurality of tools that excludes the first tool. The measurement record may be stored in the drift candidate table in response to determining that the measurement value is outside of a pre-defined range of the baseline value.

Figure 4:
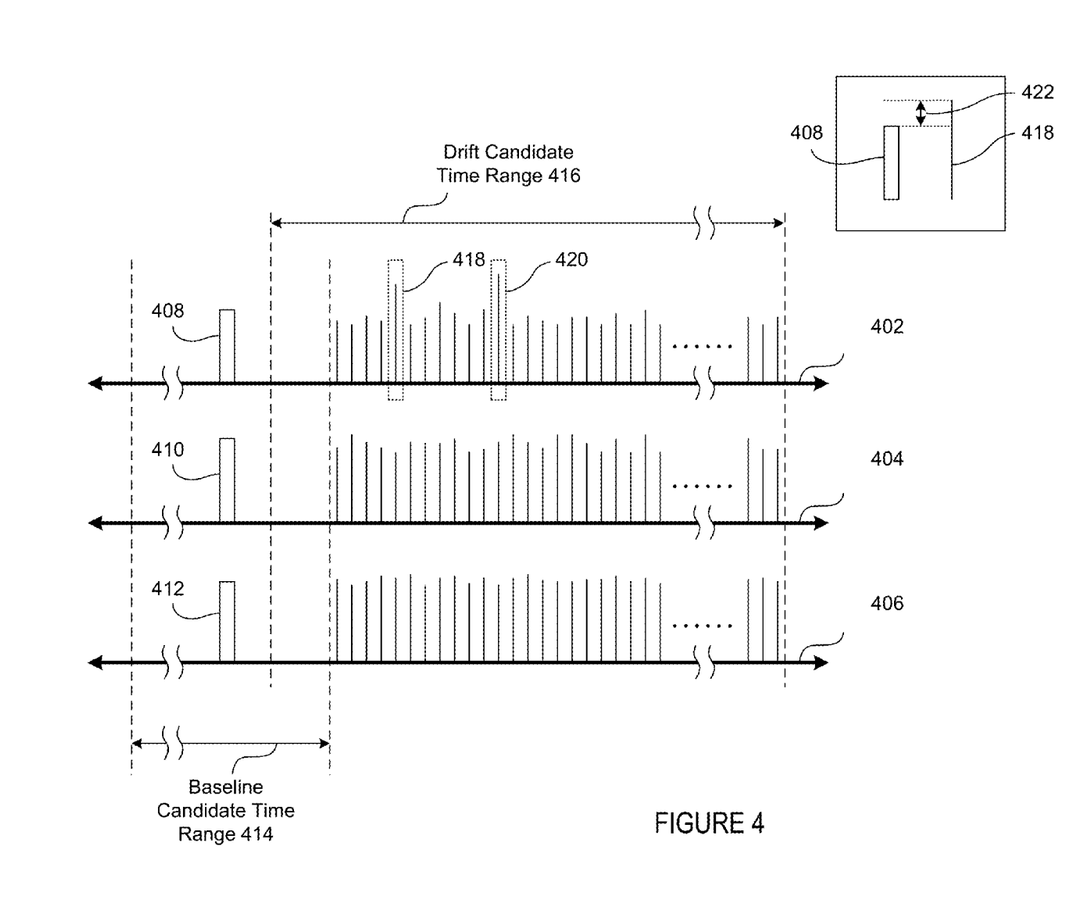
FIG. 4 illustrates drift monitoring over time according to one implementation.

Reference is now made to FIG. 4, which illustrates drift monitoring over time according to one implementation. Timelines are shown for each of tools 402, 404, and 406. Baseline references 408, 410, and 412 may correspond to fleet reference values (e.g., average values) for each of tools 402, 404, and 406, respectively. The fleet reference values may be computed from baseline candidate data (e.g., flow table data 252) averaged over a baseline candidate time range 414 (e.g., the first time range), which may be a 7-day rolling time range. Measurements may be collected during a drift candidate time range 416 (e.g., the second time range), and may be evaluated against the baseline references 408, 410, and 412 depending on the tool that performed the measurement.

As illustrated in FIG. 4, measurements 418 and 420 of tool 402 are flagged as drift candidates. For example, measurement 418 may be flagged as a drift candidate in response to determining that measurement 418 is outside of an acceptable tolerance range with respect to the baseline reference 408 of tool 402. For example, an absolute value of the difference 422 between measurement 418 and baseline reference 408 may exceed a pre-defined range (e.g., $2\sigma$, where $\sigma$ is a standard deviation computed from the baseline candidate data. Accordingly, measurement 418 may be added to the drift candidate table for later analysis (e.g., until enough data is acquired to confirm an excursion in tool 402).

Figure 5A:
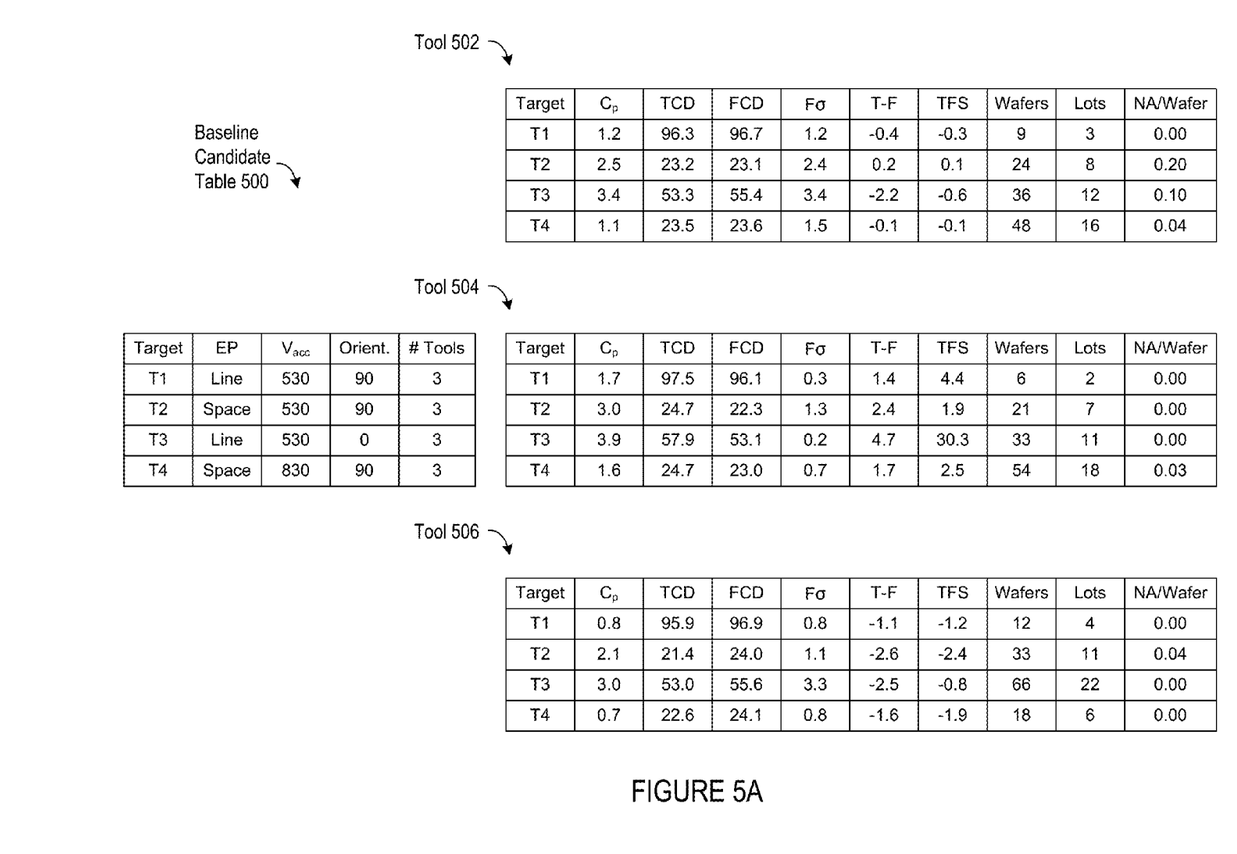
FIG. 5A shows an illustrative baseline candidate table according to one implementation.

Reference is now made to FIG. 5A, which shows an exemplary baseline candidate table 500 that includes data corresponding to various tools 502, 504, and 506. The baseline candidate table may include target information (e.g., line, space, etc.) and setpoint information (e.g., working point settings, orientation, etc.), as well as the number of tools measuring the targets. For each of tools 502, 504, and 506, data including process capability ($C_p$), tool critical dimension as measured (TCD), fleet critical dimension as measured (FCD), fleet standard deviation (F$\sigma$), tool average critical dimension minus fleet average critical dimension (T-F), tool critical dimension minus fleet critical dimension normalized to fleet standard deviation (TFS), number of wafers processed, number of lots processed, and missed measurements per semiconductor wafer sampled (NA/Waf). In some implementations, target validation filters may be applied to the data (e.g., by the fleet monitoring module 202) to determine if a measurement record of the baseline candidate table should be passed to the drift candidate table. For example, if TFS for a particular tool is greater than 2 (e.g., corresponding to a $2\sigma$ excursion), certain criteria are met before the measurement record for that tool is passed to the drift candidate table, including one or more of: a threshold number of tools (e.g., greater than 3 tools) measuring a particular target, a threshold number of wafers (e.g., greater than 10 wafers) processed by the tool, or a threshold number of lots (e.g., greater than 3 lots) processed by a tool.

Referring back to FIG. 3, at block 340, the fleet monitoring module determines if the measurement record satisfies a set of excursion rules in view of the drift candidate table. If the fleet monitoring module determines that the measurement record satisfies the set of excursion rules in view of the drift candidate table, then method 300 proceeds to block 350. At block 350, the measurement record is stored in an alert table.

Figure 5B:
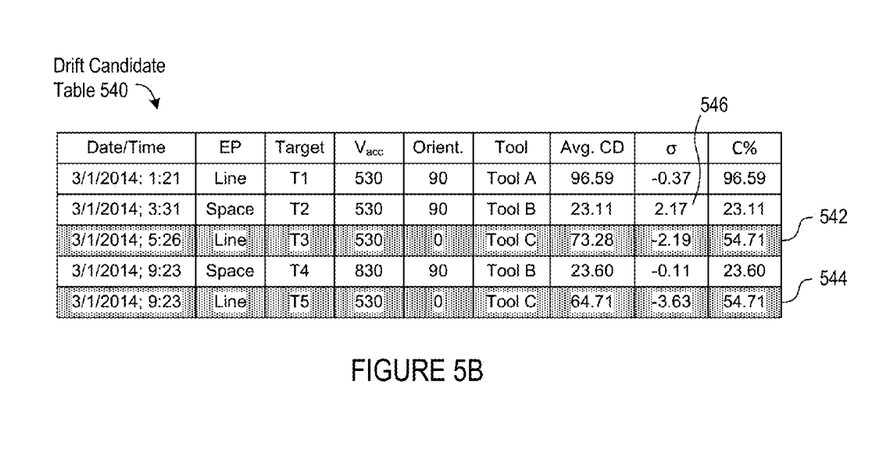
FIG. 5B shows an illustrative drift candidate table according to one implementation.

Reference is now made to FIG. 5B, which shows an exemplary drift candidate table 540. The drift candidate table contains measurement records that are likely to be indicative of excursions, as well as measurement records received during the drift candidate time range 416 (e.g., the second time range). Measurement record 546 corresponds to a measurement value that exceeds a threshold a value (e.g., $2\sigma$). Depending on the excursion rules, the measurement record 546 may not be confirmed as an excursion until the confidence interval (C %), which is computed based on the drift candidate table 540, exceeds a threshold value (e.g., 90% confidence). In some implementations, an alternative condition is such that at least a pre-defined number of drifts are observed for the same tool. For example, measurement records 542 and 544 correspond to "Tool C". Although the confidence interval does not exceed 90%, the fact that there are two potential drift candidates may signify an excursion, and the corresponding measurement records may be added to an alert table.

Figure 5C:
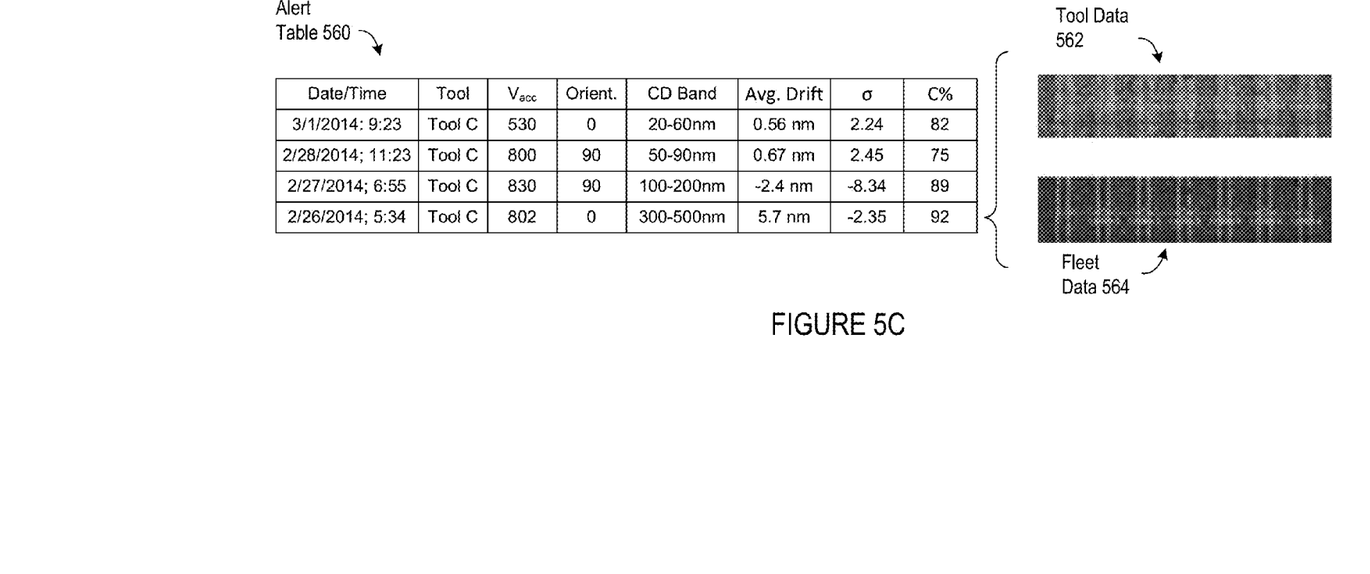
FIG. 5C shows an illustrative alert table according to one implementation.

FIG. 5C shows an illustrative alert table 560, which contains measurement records corresponding to tools having measurement drifts confirmed based on the set of excursion rules. In some implementations, the confidence interval (% C) may update in real-time as new measurement records are received and processed by the fleet monitoring module. Data from the alert table 560 may be visualized with a suitable user interface (e.g., user interface 220). In some implementations, an operator may view raw tool data 562 and raw fleet data 564 for a particular entry in the alert table 560 to visualize the drift directly (e.g., scanning electron micrographs revealing a drift in line measurements).

In some implementations, the fleet monitoring module may transmit, in view of the alert table, an alert indication to the tool (e.g., or to the MES 110 which may control the first tool). The first tool of the plurality of tools may be shut down (e.g., automatically) in response to receiving the alert indication. For example, the tool may be shut down in order for maintenance to be performed to correct the drift. In some implementations, the alert table is transmitted to a device of the manufacturing facility to be viewed via a user interface (e.g., user interface 220). An operator viewing the alert table data may determine to manually shut down the tool. In some implementations, the alert indication is generated in response to determining that the alert table, for the first tool, exceeds a threshold number of measurement records satisfying the excursion rules.

Referring back to FIG. 3, if the fleet monitoring module determines that the measurement record fails to satisfy the set of excursion rules in view of the drift candidate table, then method 300 proceeds to block 360. At block 360, the baseline measurement data is replaced with updated baseline measurement data that includes the measurement record such that the updated baseline measurement data corresponds to a subset of measurement records that exclude measurement records satisfying the set of excursion rules. In some implementations, block 360 may be omitted until a later time. For example, at midnight of each run, baseline measurement data may be updated to correspond to a new time range (e.g., one week from midnight). After method 300 ends, method 300 may be repeated at regular intervals for each new measurement received from the plurality of tools.

For simplicity of explanation, the implementations of the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

Figure 6:
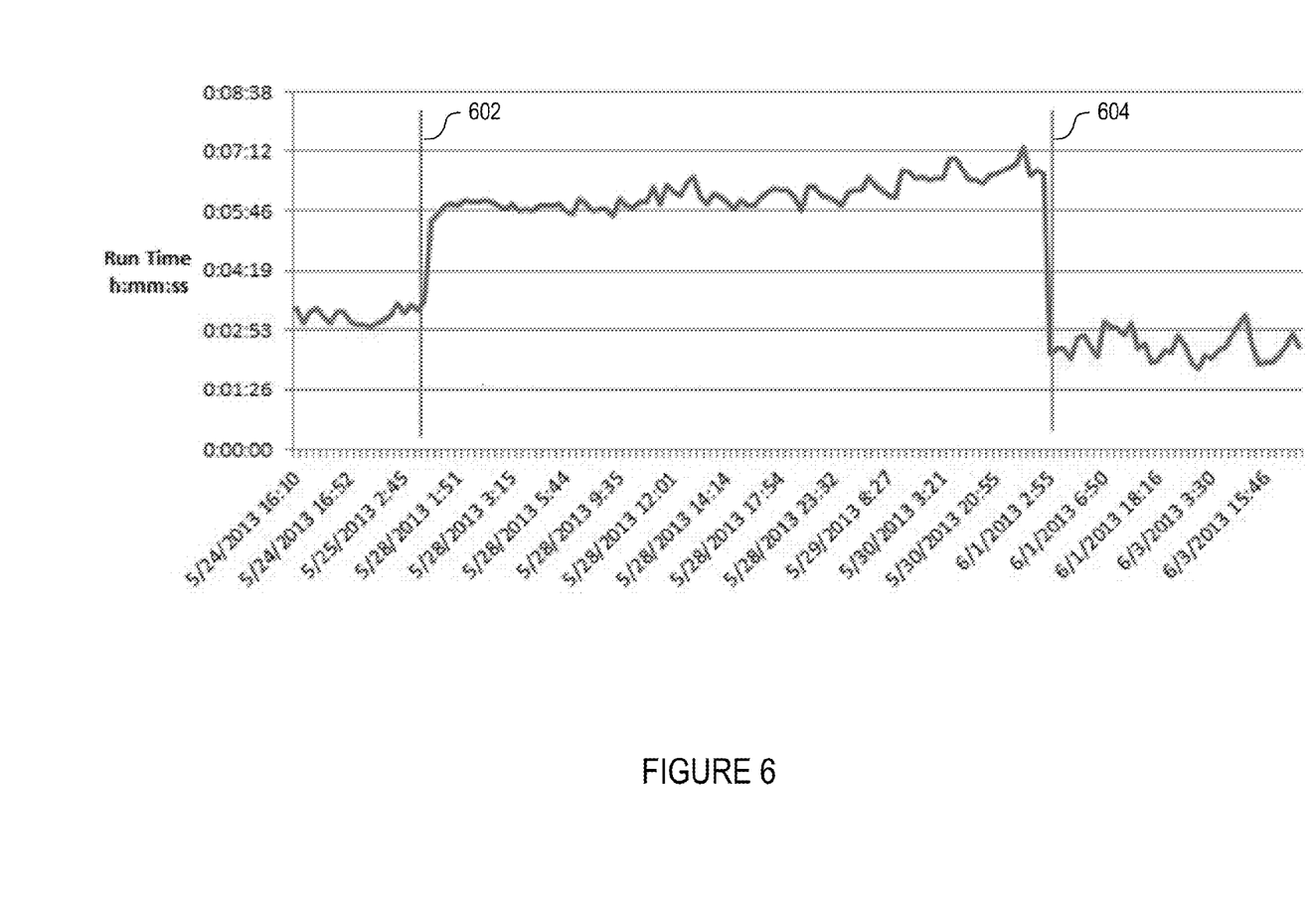
FIG. 6 shows an example of a run-time excursion.
Figure 7A:
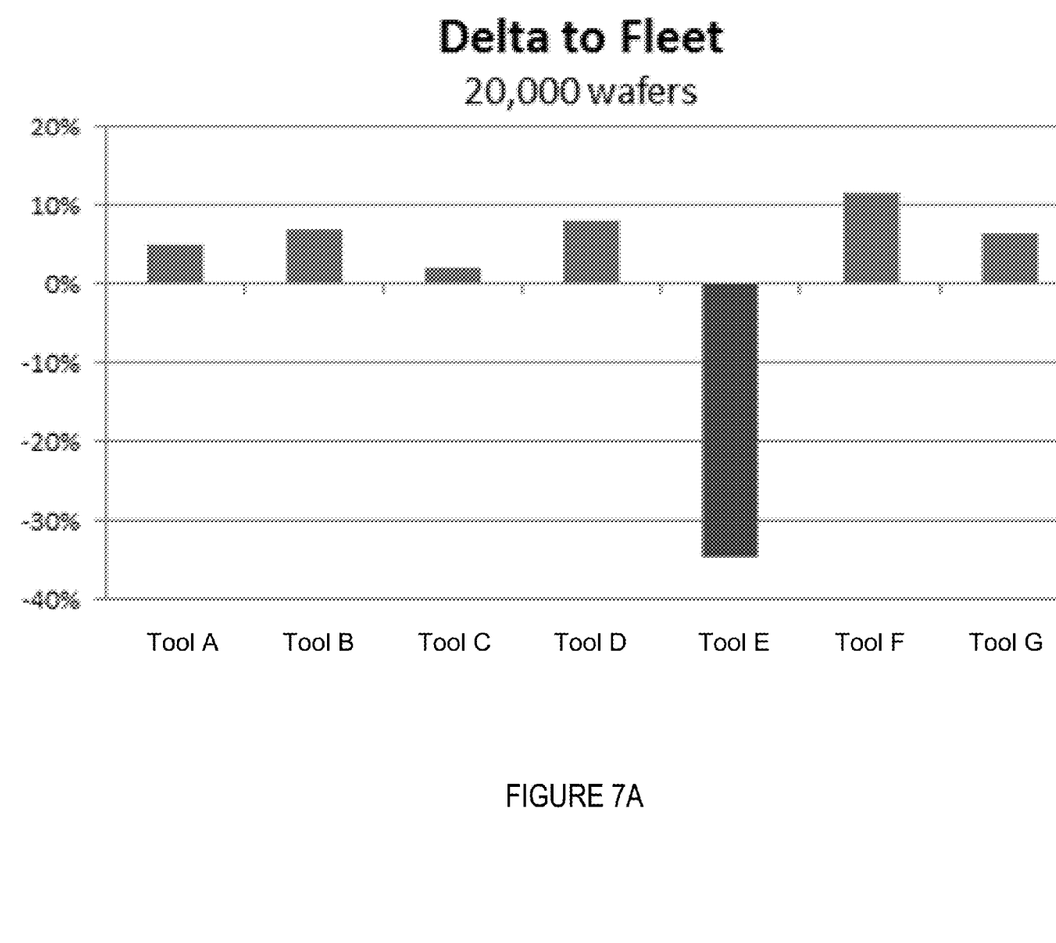
FIG. 7A shows an example of a delta-to-fleet excursion.
Figure 7B:
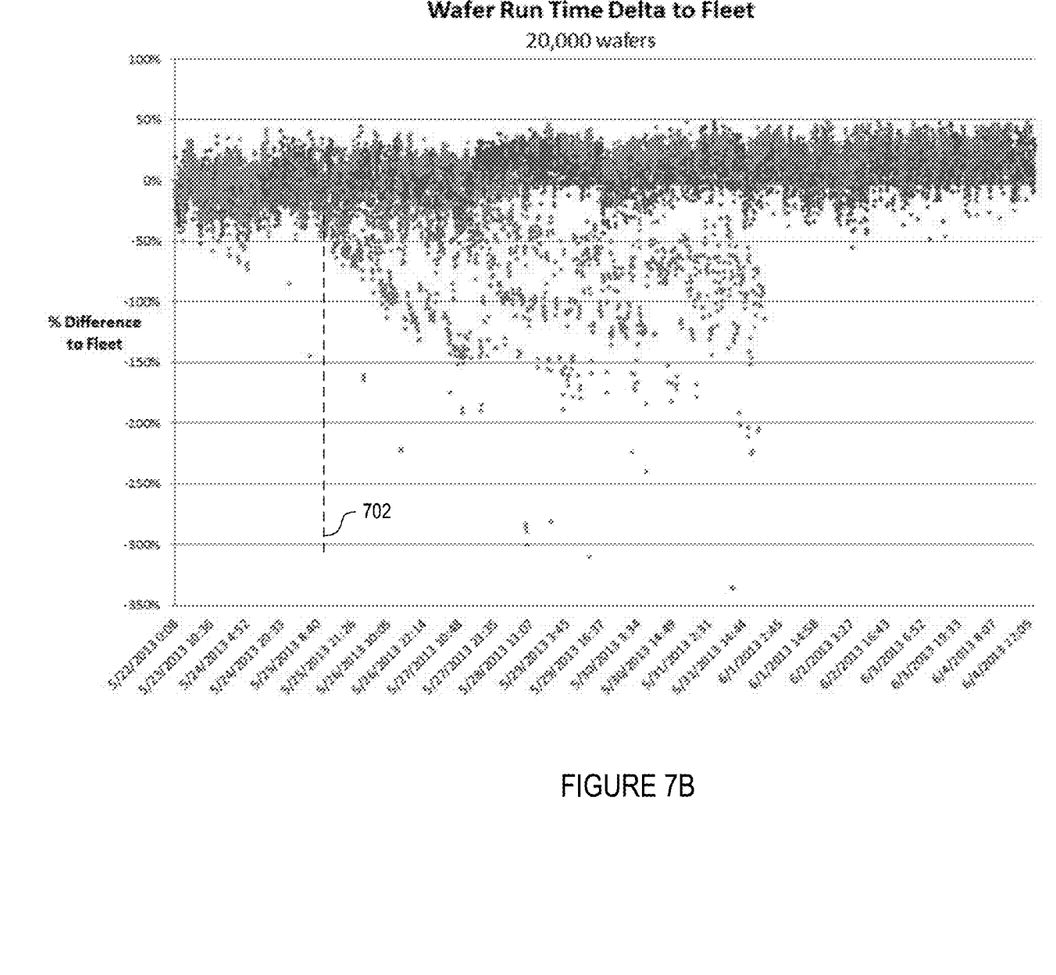
FIG. 7B shows an example of a delta-to-fleet excursion over time.

FIG. 6 shows an example of a run-time excursion. At time point 602 (e.g., May 25, 2013 at 2:45), a sharp increase in run-time occurs for a particular tool. After enough data is acquired to determine that an excursion exists, maintenance is performed on the tool at time point 604 (e.g., Jun. 1, 2013 at 2:55), resulting in a return back to an average run-time prior to the excursion. FIGS. 7A and 7B show an example of a delta-to-fleet excursion for the same tool. An analysis revealed that the delta-to-fleet (e.g., ratio of a time averaged measurement for the tool to the fleet average) increase significantly over a one-week period before maintenance was performed on the tool. By utilizing the embodiments described herein, the excursion would have been identified within 24 hours.

Figure 8:
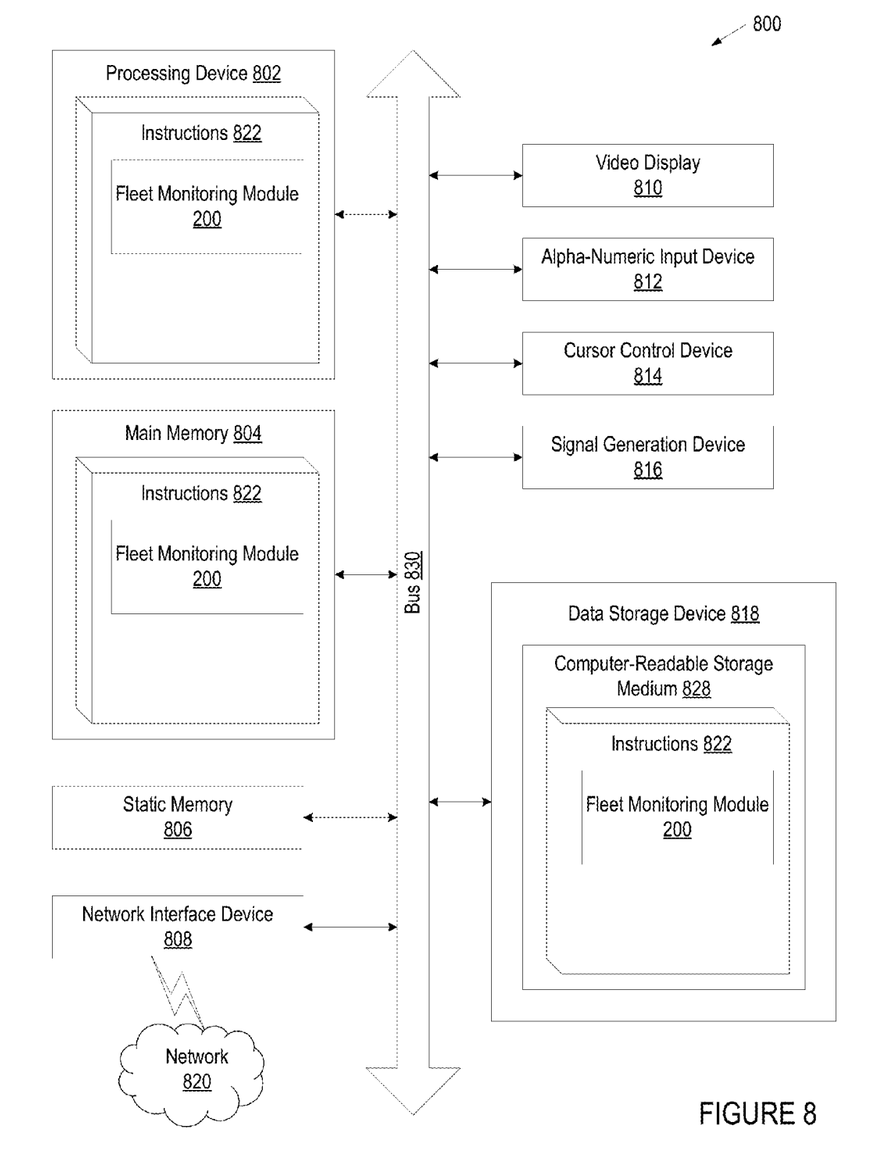
FIG. 8 is a block diagram illustrating an exemplary computing device.

FIG. 8 is a block diagram illustrating an exemplary computing device 800. In one implementation, the computing device 800 corresponds to a machine hosting the fleet monitoring module 200 of FIGS. 1 and 2. The computing device 800 includes a set of instructions for causing the machine to perform any one or more of the methodologies discussed herein. In alternative implementations, the machine may be connected (e.g., networked) to other machines in a LAN, an intranet, an extranet, or the Internet. The machine may operate in the capacity of a server machine in a client-server network environment. The machine may be a personal computer (PC), a set-top box (STB), a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computing device 800 includes a processing system (processing device) 802, a main memory 804 (e.g., read-only memory (ROM), flash memory, dynamic random access memory (DRAM) such as synchronous DRAM (SDRAM), etc.), a static memory 806 (e.g., flash memory, static random access memory (SRAM), etc.), and a data storage device 818, which all communicate with each other via a bus 830. Each of the processing device 802, the main memory 804, and the data storage device 818 are capable of storing instructions 822 related to implementation of the fleet monitoring module 200.

Processing device 802 represents one or more general-purpose processing devices such as a microprocessor, central processing unit, or the like. More particularly, the processing device 802 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 802 may also be one or more special-purpose processing devices such as an application specific integrated circuit (ASIC), a field programmable gate array (FPGA), a digital signal processor (DSP), network processor, or the like. The processing device 802 is configured to execute the fleet monitoring module 200 for performing the operations and steps discussed herein.

The computing device 800 may further include a network interface device 808. The computing device 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

The data storage device 818 may include a computer-readable storage medium 828 on which is stored one or more sets of instructions (e.g., instructions 822 for implementing the fleet monitoring module 200) embodying any one or more of the methodologies or functions described herein. The fleet monitoring module 200 may also reside, completely or at least partially, within the main memory 804 and/or within the processing device 802 during execution thereof by the computing device 800, the main memory 804 and the processing device 802 also constituting computer-readable media. The fleet monitoring module 200 may further be transmitted or received over a network 820, such as network 140, via the network interface device 808.

While the computer-readable storage medium 828 is shown in an example implementation to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, transitory computer-readable storage media, including, but not limited to, propagating electrical or electromagnetic signals, and non-transitory computer-readable storage media including, but not limited to, volatile and non-volatile computer memory or storage devices such as a hard disk, solid-state memory, optical media, magnetic media, floppy disk, USB drive, DVD, CD, media cards, register memory, processor caches, random access memory (RAM), etc.

In the above description, numerous details are set forth. It will be apparent, however, to one of ordinary skill in the art having the benefit of this disclosure, that implementations of the disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining," "adding," "providing," or the like, refer to the actions and processes of a computing device, or similar electronic computing device, that manipulates and transforms data represented as physical (e.g., electronic) quantities within the computing device's registers and memories into other data similarly represented as physical quantities within the computing device memories or registers or other such information storage devices.

Implementations of the disclosure also relate to an apparatus for performing the operations herein. This apparatus may be specially constructed for its desired purposes, or it may comprise a general purpose computer selectively activated or reconfigured by a computer program stored in the computer. Such a computer program may be stored in a computer readable storage medium, such as, but not limited to, any type of disk including optical disks, CD-ROMs, and magnetic-optical disks, read-only memories (ROMs), random access memories (RAMs), EPROMs, EEPROMs, magnetic or optical cards, or any type of media suitable for storing electronic instructions.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation. Moreover, it is noted that the "A-Z" notation used in reference to certain elements of the drawings is not intended to be limiting to a particular number of elements. Thus, "A-Z" is to be construed as having one or more of the element present in a particular implementation.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   maintaining, by a processing device, baseline measurement data generated from measurements performed by a plurality of tools over a first rolling time range;
   receiving, by the processing device, a plurality of measurement records each corresponding to a measurement performed on a wafer over a second rolling time range that is advanced in time at a same rate as the first rolling time range, the wafer having been processed by a first tool of the plurality of tools;
   filtering, by the processing device, the plurality of measurement records to identify a plurality of drift candidate records, and storing the drift candidate records in a drift candidate table;
   determining, by the processing device, whether one or more of the drift candidate records satisfies a set of excursion rules applied to the plurality of drift candidate records;
   in response to determining that the one or more of the drift candidate records satisfies the set of excursion rules, flagging the one or more of the drift candidate records by storing the one or more drift candidate records in an alert table;

transmitting, in view of the alert table, an alert indication to the first tool of the plurality of tools, wherein the first tool of the plurality of tools is to shut down in response to receiving the alert indication; and updating, by the processing device, the baseline measurement data and the drift candidate table, wherein measurement data corresponding to measurements performed outside of the first rolling time range are discarded from the baseline measurement data or archived as the first rolling time range is advanced in time, and wherein at least one drift candidate record is removed from the drift candidate table and added to the baseline measurement data as the second rolling time range is advanced in time provided that the at least one drift candidate record does not satisfy the set of excursion rules.

2. The method of claim 1, wherein the alert indication is to be generated in response to determining that the alert table, for the first tool, exceeds a threshold number of drift candidate records satisfying the excursion rules.

3. The method of claim 1, wherein the set of excursion rules comprises one or more of determining that a measurement value associated with a drift candidate record exceeds a first threshold range with a confidence value computed in view of the drift candidate table, determining that a pre-defined number of excursions have occurred for the first tool during the second time range, determining that the measurement value associated with the drift candidate record exceeds a second threshold range with respect to an average critical dimension computed from the baseline measurement data.

4. The method of claim 1, wherein storing the plurality of drift candidate records in the drift candidate table comprises:
comparing a measurement value associated with a drift candidate record to a baseline value, wherein the baseline value is computed from average measurement values of the baseline measurement data, the average measurement values being associated with a subset of the plurality of tools that excludes the first tool; and
storing the drift candidate record in the drift candidate table in response to determining that the measurement value is outside of a pre-defined range of the baseline value.

5. The method of claim 1, wherein the measurements performed by the plurality of tools comprise at least one of a line width measurement, a line spacing measurement, or a hole diameter measurement.

6. A system comprising:
a memory; and
a processing device coupled to the memory, wherein the processing device is to:
maintain baseline measurement data generated from measurements performed by a plurality of tools over a first rolling time range;
receive a plurality of measurement records each corresponding to a measurement performed on a wafer over a second rolling time range that is advanced in time at a same rate as the first rolling time range, the wafer having been processed by a first tool of the plurality of tools;
filter the plurality of measurement records to identify a plurality of drift candidate records, and store the drift candidate records in a drift candidate table corresponding;
determine whether one or more of the drift candidate records satisfies a set of excursion rules applied to the plurality of drift candidate records;

flag the one or more of the drift candidate records by storing the one or more drift candidate records in an alert table in response to determining that the one or more of the drift candidate records satisfies the set of excursion rules;

transmit, in view of the alert table, an alert indication to the first tool of the plurality of tools, wherein the first tool of the plurality of tools is to shut down in response to receiving the alert indication; and update the baseline measurement data and the drift candidate table, wherein measurement data corresponding to measurements performed outside of the first rolling time range are discarded from the baseline measurement data or archived as the first rolling time range is advanced in time, and wherein at least one drift candidate record is removed from the drift candidate table and added to the baseline measurement data as the second rolling time range is advanced in time provided that the at least one drift candidate record does not satisfy the set of excursion rules.

7. The system of claim 6, wherein the alert indication is to be generated in response to determining that the alert table exceeds a threshold number of drift candidate records corresponding to the first tool.

8. The system of claim 6, wherein the set of excursion rules comprises one or more of determining that a measurement value associated with a drift candidate record exceeds a first threshold range with a confidence value computed in view of the drift candidate table, determining that a pre-defined number of excursions have occurred for the first tool during the second time range, determining that the measurement value associated with the drift candidate record exceeds a second threshold range with respect to an average critical dimension computed from the baseline measurement data.

9. The system of claim 6, wherein to store the plurality of drift candidate records in the drift candidate table, the processing device is further to:
compare a measurement value associated with a drift candidate record to a baseline value, wherein the baseline value is computed from average measurement values of the baseline measurement data, the average measurement values being associated with a subset of the plurality of tools that excludes the first tool; and
store the drift candidate record in the drift candidate table in response to determining that the measurement value is outside of a pre-defined range of the baseline value.

10. A non-transitory computer-readable storage medium having instructions encoded thereon that, when executed, cause a processing device to perform operations comprising:
maintaining baseline measurement data generated from measurements performed by a plurality of tools over a first rolling time range;
receiving a plurality of measurement records each corresponding to a measurement performed on a wafer over a second rolling time range that is advanced in time at a same rate as the first rolling time range, the wafer having been processed by a first tool of the plurality of tools;
filtering the plurality of measurement records to identify a plurality of drift candidate records, and storing the drift candidate records in a drift candidate table;
determining whether one or more of the drift candidate records satisfies a set of excursion rules applied to the plurality of drift candidate records;

in response to determining that the one or more of the drift candidate records satisfies the set of excursion rules, flagging the one or more of the drift candidate records by storing the one or more drift candidate records in an alert table;

transmitting, in view of the alert table, an alert indication to the first tool of the plurality of tools, wherein the first tool of the plurality of tools is to shut down in response to receiving the alert indication; and updating the baseline measurement data and the drift candidate table, wherein measurement data corresponding to measurements performed outside of the first rolling time range are discarded from the baseline measurement data or archived as the first rolling time range is advanced in time, and wherein at least one drift candidate record is removed from the drift candidate table and added to the baseline measurement data as the second rolling time range is advanced in time provided that the at least one drift candidate record does not satisfy the set of excursion rules.

11. The non-transitory computer-readable storage medium of claim 10, wherein the alert indication is to be generated in response to determining that the alert table exceeds a threshold number of drift candidate records satisfying the excursion rules that correspond to the first tool.

12. The non-transitory computer-readable storage medium of claim 10, wherein the set of excursion rules comprises one or more of determining that a measurement value associated with a drift candidate record exceeds a first threshold range with a confidence value computed in view of the drift candidate table, determining that a pre-defined number of excursions have occurred for the first tool during the second time range, determining that the measurement value associated with the drift candidate record exceeds a second threshold range with respect to an average critical dimension computed from the baseline measurement data.

13. The non-transitory computer-readable storage medium of claim 10, wherein storing the plurality of drift candidate records in the drift candidate table comprises:

comparing a measurement value associated with a drift candidate record to a baseline value, wherein the baseline value is computed from average measurement values of the baseline measurement data, the average measurement values being associated with a subset of the plurality of tools that excludes the first tool; and storing the drift candidate record in the drift candidate table in response to determining that the measurement value is outside of a pre-defined range of the baseline value.

* * * * *